(12) United States Patent
Anderson et al.

(10) Patent No.: US 11,929,300 B2
(45) Date of Patent: Mar. 12, 2024

(54) METHOD FOR PACKAGING AN INTEGRATED CIRCUIT (IC) PACKAGE WITH EMBEDDED HEAT SPREADER IN A REDISTRIBUTION LAYER (RDL)

(71) Applicant: Qorvo US, Inc., Greensboro, NC (US)

(72) Inventors: Kevin J. Anderson, Plano, TX (US); Andrew Arthur Ketterson, Dallas, TX (US); Tarak A. Railkar, Plano, TX (US); Deep C. Dumka, Richardson, TX (US); Christo Bojkov, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/173,418

(22) Filed: Feb. 23, 2023

(65) Prior Publication Data

US 2023/0207415 A1 Jun. 29, 2023

Related U.S. Application Data

(62) Division of application No. 16/712,271, filed on Dec. 12, 2019, now Pat. No. 11,626,340.

(51) Int. Cl.
*H01L 23/367* (2006.01)
*H01L 21/56* (2006.01)
(Continued)

(52) U.S. Cl.
CPC .......... *H01L 23/367* (2013.01); *H01L 21/565* (2013.01); *H01L 21/568* (2013.01);
(Continued)

(58) Field of Classification Search
CPC . H01L 23/367; H01L 23/66; H01L 23/49827; H01L 23/552; H01L 21/56;
(Continued)

(56) References Cited

U.S. PATENT DOCUMENTS 5,177,669 A 1/1993 Juskey et al.
8,304,292 B1 11/2012 Lin et al.
(Continued)

FOREIGN PATENT DOCUMENTS

EP 2587899 A1 5/2013

OTHER PUBLICATIONS

Meyer, T., et al., Embedded Wafer Level Ball Grid Array (eWLB), 2008 10th Electronics Packaging Technology Conference, IEEE, Singapore, Dec. 9-12, 2008, pp. 994-998.
(Continued)

*Primary Examiner* — Khiem D Nguyen
(74) *Attorney, Agent, or Firm* — Withrow & Terranova, P.L.L.C.

(57) ABSTRACT

An integrated circuit (IC) package with an embedded heat spreader in a redistribution layer (RDL) is provided. IC packaging facilitates a high density package for ICs, including monolithic microwave integrated circuits (MMICs). However, IC packaging may result in reduced heat removal from an IC, decreasing radio frequency (RF) circuit performance. In an exemplary aspect, an IC package is provided which incorporates an embedded heat spreader within a dielectric layer of an RDL coupled to an IC die. The embedded heat spreader provides efficient heat transfer, robust RF performance, and operation through millimeter wave (mmW) frequencies, all in a miniature low-cost, low-profile surface mountable (SM) package.

18 Claims, 5 Drawing Sheets

(51) Int. Cl.
*H01L 21/78* (2006.01)
*H01L 23/00* (2006.01)
*H01L 23/31* (2006.01)
*H01L 23/373* (2006.01)
*H01L 23/48* (2006.01)
*H01L 23/66* (2006.01)
*H01L 25/10* (2006.01)

(52) U.S. Cl.
CPC .......... *H01L 21/78* (2013.01); *H01L 23/3121* (2013.01); *H01L 23/3736* (2013.01); *H01L 23/481* (2013.01); *H01L 23/66* (2013.01); *H01L 24/19* (2013.01); *H01L 24/20* (2013.01); *H01L 24/24* (2013.01); *H01L 24/97* (2013.01); *H01L 25/105* (2013.01); *H01L 2223/6616* (2013.01); *H01L 2223/6627* (2013.01); *H01L 2223/6683* (2013.01); *H01L 2224/221* (2013.01); *H01L 2224/24145* (2013.01); *H01L 2225/1035* (2013.01); *H01L 2225/1058* (2013.01); *H01L 2225/1094* (2013.01); *H01L 2924/1423* (2013.01)

(58) Field of Classification Search
CPC ......... H01L 21/568; H01L 2224/13147; H01L 2924/00014; H01L 21/565; H01L 21/78; H01L 23/3121; H01L 23/481; H01L 23/3128; H01L 23/49822; H01L 24/13; H01L 24/19; H01L 24/20; H01L 24/24; H01L 24/97
See application file for complete search history.

(56) References Cited

U.S. PATENT DOCUMENTS

| | | | |
|---|---|---|---|
| 8,587,956 B2 | 11/2013 | Choutov et al. | |
| 9,064,936 B2 | 6/2015 | Lin et al. | |
| 9,502,330 B1 | 11/2016 | Gupta et al. | |
| 9,589,864 B2 | 3/2017 | Railkar | |
| 9,922,964 B1* | 3/2018 | Chen | H01L 23/5389 |
| 10,685,924 B2 | 6/2020 | Lasiter et al. | |
| 10,910,326 B2* | 2/2021 | Nishihara | H01L 23/562 |
| 11,291,146 B2* | 3/2022 | Lin | H01L 21/4857 |
| 11,335,620 B2* | 5/2022 | Hill | H01L 28/10 |
| 11,626,340 B2 | 4/2023 | Anderson et al. | |
| 2006/0131735 A1 | 6/2006 | Ong et al. | |
| 2010/0252312 A1 | 10/2010 | Wolde-Giorgis et al. | |
| 2011/0244636 A1 | 10/2011 | Kondo | |
| 2012/0106109 A1 | 5/2012 | Kim et al. | |
| 2012/0199955 A1 | 8/2012 | Sun | |
| 2013/0201631 A1 | 8/2013 | Parker et al. | |
| 2013/0241039 A1 | 9/2013 | Choi et al. | |
| 2013/0308274 A1* | 11/2013 | Murdock | H01L 23/373 361/717 |
| 2014/0110841 A1* | 4/2014 | Beer | H01Q 9/16 257/738 |
| 2014/0131898 A1 | 5/2014 | Shearer et al. | |
| 2015/0187676 A1 | 7/2015 | Won et al. | |
| 2015/0348865 A1 | 12/2015 | Vincent et al. | |
| 2017/0084576 A1* | 3/2017 | Yu | H01L 21/56 |
| 2017/0085228 A1* | 3/2017 | Abdo | H01L 24/83 |
| 2017/0250138 A1 | 8/2017 | Hsieh et al. | |
| 2018/0205134 A1 | 7/2018 | Khan et al. | |
| 2018/0233452 A1 | 8/2018 | Lin et al. | |
| 2018/0342434 A1 | 11/2018 | Ziglioli | |
| 2019/0206839 A1 | 7/2019 | Balakrishnan et al. | |
| 2019/0267338 A1 | 8/2019 | Kim et al. | |
| 2019/0279881 A1* | 9/2019 | Do | H01L 21/4853 |
| 2019/0295918 A1 | 9/2019 | Trulli et al. | |
| 2019/0319349 A1 | 10/2019 | Loeher et al. | |
| 2021/0183722 A1 | 6/2021 | Anderson et al. | |

OTHER PUBLICATIONS

Non-Final Office Action for U.S. Appl. No. 14/937,550, dated May 12, 2016, 9 pages.
Non-Final Office Action for U.S. Appl. No. 14/937,550, dated Sep. 8, 2016, 13 pages.
Notice of Allowance for U.S. Appl. No. 14/937,550, dated Oct. 21, 2016, 7 pages.
Non-Final Office Action for U.S. Appl. No. 16/712,271, dated Jun. 7, 2021, 12 pages.
Final Office Action for U.S. Appl. No. 16/712,271, dated Nov. 16, 2021, 16 pages.
Non-Final Office Action for U.S. Appl. No. 16/712,271, dated Mar. 3, 2022, 20 pages.
Quayle Action for U.S. Appl. No. 16/712,271, mailed Sep. 12, 2022, 7 pages.
Notice of Allowance for U.S. Appl. No. 16/712,271, dated Dec. 9, 2022, 8 pages.

* cited by examiner

METHOD FOR PACKAGING AN INTEGRATED CIRCUIT (IC) PACKAGE WITH EMBEDDED HEAT SPREADER IN A REDISTRIBUTION LAYER (RDL)

RELATED APPLICATIONS

This application is a divisional of U.S. patent application Ser. No. 16/712,271, filed Dec. 12, 2019, issued as U.S. Pat. No. 11,626,340, the disclosure of which is hereby incorporated herein by reference in its entirety.

FIELD OF THE DISCLOSURE

This application relates to packaging of radio frequency (RF) integrated circuits (ICs).

BACKGROUND

Mobile devices, such as cellular phones, demand increasingly smaller integrated circuits (ICs), including radio frequency (RF) circuits. The performance of high-frequency RF circuits in general and monolithic microwave integrated circuits (MMICs) in particular is sensitive to operating temperature of IC components. As IC package and module sizes decrease, transferring heat from IC components becomes more challenging.

SUMMARY

An integrated circuit (IC) package with an embedded heat spreader in a redistribution layer (RDL) is provided. IC packaging, such as fan-out wafer-level packaging (FOWLP), fan-out panel-level packaging (FOPLP), fan-in wafer-level packaging (FIWLP), fan-in panel-level packaging (FIPLP), or wafer-level chip scale packaging (WLCSP) facilitates a high density package for ICs, including monolithic microwave integrated circuits (MMICs). However, IC packaging may result in reduced heat removal from an IC, decreasing radio frequency (RF) circuit performance. In an exemplary aspect, an IC package is provided which incorporates an embedded heat spreader within a dielectric layer of a RDL coupled to an IC die. The embedded heat spreader provides efficient heat transfer, robust RF performance, and operation through millimeter wave (mmW) frequencies, all in a miniature low-cost, low-profile surface mountable (SM) package.

The IC die includes an active side with active components, such as transistors, diodes, and RF transmission lines for an RF circuit. The RDL with the embedded heat spreader is coupled to a backside of the IC die opposite the active side. In some examples, through semiconductor vias (TSVs) through the IC die can facilitate a chip side up orientation of the IC die in the IC package, such that the active side is oriented away from the RDL and a next higher assembly (NHA) to which the IC package attaches. The resulting package platform can mitigate the detrimental effects of packaging on efficient heat removal, reduce undesirable electromagnetic (EM) coupling, and otherwise improve RF performance. When combined with other technologies, such as copper pillar (CuP) bumping, the IC package can further facilitate three-dimensional (3D) assemblies using chip-stacking and package-on-package (POP) methods.

An exemplary embodiment provides an IC package. The IC package includes an IC die having an active side and a backside opposite the active side. The IC package further includes a backside RDL coupled to the backside of the IC die and comprising: a backside dielectric layer; and an embedded heat spreader in the backside dielectric layer and connected to the backside of the IC die.

Another exemplary embodiment further provides a method for packaging an IC. The method includes providing an IC die having an active side and a backside opposite the active side. The method further includes forming a backside RDL over the backside of the IC die by embedding a heat spreader within a backside dielectric layer. The heat spreader is connected to the backside of the IC die and extends through a thickness of the dielectric material.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
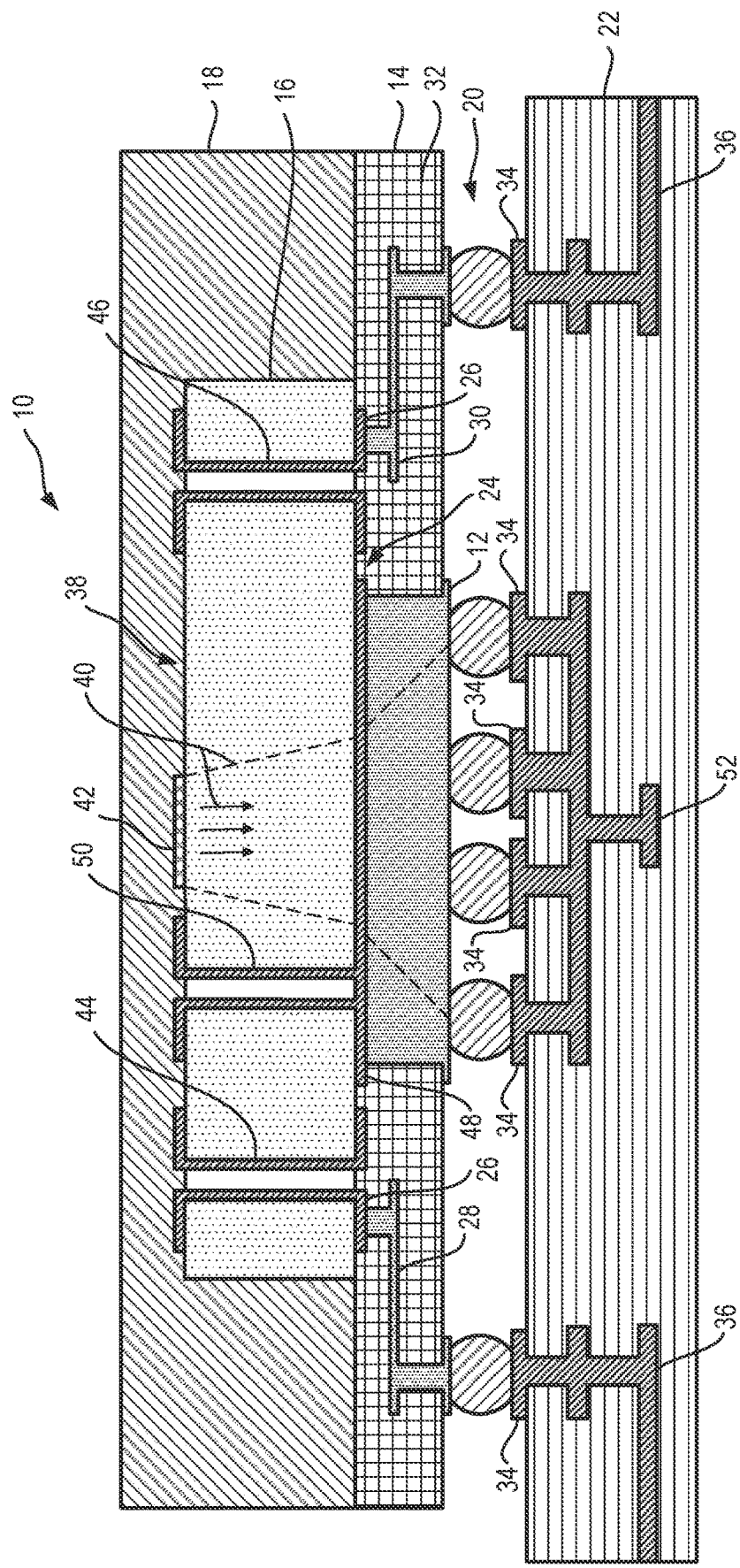
FIG. 1 is a cross-sectional view of an exemplary embodiment of an integrated circuit (IC) package with an embedded heat spreader in a backside redistribution layer (RDL).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

An integrated circuit (IC) package with an embedded heat spreader in a redistribution layer (RDL) is provided. IC packaging, such as fan-out wafer-level packaging (FOWLP), fan-out panel-level packaging (FOPLP), fan-in wafer-level packaging (FIWLP), fan-in panel-level packaging (FIPLP), or wafer-level chip scale packaging (WLCSP) facilitates a high density package for ICs, including monolithic microwave integrated circuits (MMICs). However, IC packaging may result in reduced heat removal from an IC, decreasing radio frequency (RF) circuit performance. In an exemplary aspect, an IC package is provided which incorporates an embedded heat spreader within a dielectric layer of a RDL coupled to an IC die. The embedded heat spreader provides efficient heat transfer, robust RF performance, and operation through millimeter wave (mmW) frequencies, all in a miniature low-cost, low-profile surface mountable (SM) package.

The IC die includes an active side with active components, such as transistors, diodes, and RF transmission lines for an RF circuit. The RDL with the embedded heat spreader is coupled to a backside of the IC die opposite the active side. In some examples, through semiconductor vias (TSVs) through the IC die can facilitate a chip side up orientation of the IC die in the IC package, such that the active side is oriented away from the RDL and a next higher assembly (NHA) to which the IC package attaches. The resulting package platform can mitigate the detrimental effects of packaging on efficient heat removal, reduce undesirable electromagnetic (EM) coupling, and otherwise improve RF performance. When combined with other technologies, such as copper pillar (CuP) bumping, the IC package can further facilitate three-dimensional (3D) assemblies using chip-stacking and package-on-package (POP) methods.

FIG. 1 is a cross-sectional view of an exemplary embodiment of an IC package 10 with an embedded heat spreader 12 in a backside RDL 14. The IC package 10 includes an IC die 16 surrounded by an overmold layer 18 and attached to the backside RDL 14. An interconnection layer 20 attaches the backside RDL 14 to an NHA 22, which may be a printed circuit board (PCB) or another component which supports the IC package 10 and/or electrically connects the IC package 10 to other components in an RF device (e.g., a mobile device).

In this regard, the IC package 10 can include a MMIC and form an RF module in which the IC die 16 is packaged using FOWLP, also referred to as wafer-level fan-out (WLFO) packaging. Other examples are packaged with FOPLP or a similar packaging approach. FOWLP and FOPLP are packaging technologies that allow the use of semiconductor-like thin-film processes (e.g., high-resolution lithographic patterning, physical vapor deposition (PVD) metallizations and chemical vapor deposition (CVD) dielectrics) to spread out (e.g., fan out) dense input/output (I/O) connections on the IC die 16 to accommodate the larger dimensions on the NHA 22, such as a PCB, interposer, or chip-scale package (CSP).

Some examples are packaged with FIWLP, FIPLP or similar fan-in packaging approaches. FIWLP and FIPLP are packaging technologies similar to FOWLP and FOPLP, which condense (e.g., fan in) I/O connections on the IC die 16 to accommodate the dimensions of the NHA 22. In some examples, wafer-level chip scale packaging (WLCSP) or other technologies may be used. In some examples, the IC package 10 can include multiple IC dice 16 and/or other circuit components to form a multi-chip module (MCM) or multi-chip package (MCP). In such examples, a common backside RDL 14 may make connections between the IC dice 16 and/or other circuit components.

For example, in one embodiment of the FOWLP process, known-good die (KGD) (e.g., the IC die 16 and a plurality of additional IC dice) and sometimes other passive components are precisely placed onto a temporary carrier (not shown), often called a reconstructed wafer, and epoxy over-molded to form the overmold layer 18. The KGD can be formed from one or more IC wafers which are diced to form the IC die 16 and a plurality of additional IC dice, then overmolded into an overmolded IC array. A portion of the overmold layer 18 can be removed to expose a back and/or top surface of the IC die 16 (e.g., a backside 24 of the IC die 16) such that the overmold layer 18 partially surrounds the IC die 16 (e.g., surrounding only lateral sides of the IC die 16 or the lateral sides and one of the topside or backside 24 of the IC die 16).

One or more RDLs (e.g., fan-out RDLs for FOWLP or FOPLP, fan-in RDLs for FIWLP or FIPLP, or other RDLs for chip-scale packaging) and dielectric layers are formed over the exposed surface of the IC die 16, and via holes are defined using semiconductor-like processes and tools to route metal traces away from tightly pitched backside signal pads 26 on the IC die 16 to the periphery of the IC package 10 (or to other components within the same package in the case of a multi-chip module). Thus, the backside RDL 14 includes a plurality of signal lines 28, 30 connected to the backside signal pads 26 (e.g., conductors of the IC die 16) and a backside dielectric layer 32 which isolates at least some of the signal lines 28, 30 from one another. For example, a first signal line 28 may be isolated from a second signal line 30.

Depending on whether a chips-first or chips-last approach is used, the backside RDL 14 interconnects (e.g., signal lines 28, 30) are either formed directly on top of the overmolded IC die 16 or are formed on the carrier before the IC die 16 (and other components) is attached and overmolded. In some examples, the backside RDL 14 is formed as a multilayer laminate. With the backside signal pads 26 now redistributed (e.g., fanned out for a fan-out package, fanned in for a fan-in package, or otherwise redistributed), the IC package 10 is capable of being attached to NHA pads 34 arrayed at a different pitch on the NHA 22 (here illustrated as a multilayer PCB with a wider pitch, though other configurations can be used). The interconnection layer 20 (e.g., a ball grid array, a land-grid array, or another appropriate interconnection) is used to attach the IC package 10 to the NHA 22 and connect the signal lines 28, 30 in the backside RDL 14 to the NHA pads 34 and NHA conductors 36 (e.g., routing to other components attached to the NHA 22). After the backside RDL 14 or the interconnection layer 20 is formed, the overmolded IC array can be diced into the IC package 10.

The IC die 16 includes an active side 38, which may be referred to as a topside of the IC die 16. The embedded heat spreader 12 is embedded within the backside dielectric layer 32 of the backside RDL 14. This provides highly efficient thermal spreading and heat transfer 40 from components 42 (e.g., active components such as diodes and transistors and/or passive components, such as RF transmission lines, tuning networks, interconnecting inductors, capacitors, inductors, etc.) on the active side 38 of the IC die 16 through the backside 24 of the IC die 16.

In an exemplary aspect, with the backside RDL 14 having the embedded heat spreader 12, the IC die 16 is oriented chip side up in the IC package 10. That is, the chip side (e.g., the active side 38) of the IC die 16 is oriented away from the backside RDL 14, and the backside RDL 14 is attached to the backside 24 of the IC die 16. One or more TSVs 44, 46 are provided through the IC die 16 to interface with the corresponding signal lines 28, 30 in the backside RDL 14. For example, a first TSV 44 connects the first signal line 28 to a component 42 on the active side 38 of the IC die 16 (through a backside signal pad 26), and a second TSV 46 connects the second signal line 30 to another component 42 on the active side 38 (through another backside signal pad 26). The TSVs 44, 46 provide a connectivity solution for the IC die 16 which is spatially efficient, connecting the backside 24 to the active side 38 with a relatively smaller diameter via. By contrast, use of through mold vias (TMVs) in conventional fan-out 3D packaging adds to the package footprint since extra space is needed adjacent to the IC die 16 to transfer the electrical signals.

In some examples, the backside 24 of the IC die 16 includes the backside signal pads 26 and a backside ground plane 48 (covering a portion or majority of the backside 24), which can provide grounding for the components 42 on the active side 38 and further improve thermal spreading and heat transfer 40 from the IC die 16. One or more ground TSVs 50 can connect the backside ground plane 48 (and an NHA ground plane 52 in the NHA 22) to an element or component 42 on the active side 38 of the IC die 16.

The embedded heat spreader 12 can be a solid metal which spans a thickness of the backside dielectric layer 32 (e.g., defined transverse to the backside 24 surface), such that the backside dielectric layer 32 surrounds the sides of the embedded heat spreader 12. A width of the embedded heat spreader 12 (e.g., coplanar with the backside dielectric layer 32) is generally greater than the thickness of the backside dielectric layer 32 and the embedded heat spreader 12 to further improve heat spreading and provide a larger surface area for heat transfer to the NHA 22 and/or a heat exchanger. The embedded heat spreader 12 can be deposited over the backside 24 of the IC die 16 (e.g., over the backside ground plane 48) during formation of the backside RDL 14 through an appropriate technique, such as vapor deposition, sputtering, evaporation, spin-on, plating, printing, chemical deposition, lamination, and combinations of these techniques.

The backside dielectric layer 32 and signal lines 28, 30 of the backside RDL 14 are formed over the backside 24 of the IC die 16. The backside dielectric layer 32 can include one or more of polyimide, polynorbornenes, benzocyclobutene (BCB), polytetrafluoroethylene (PTFE), hydrogen silsesquioxane (HSQ), methylsilsesquioxane (MSQ), or other dielectric materials having good RF properties. Other examples include inorganic dielectrics, such as silicon dioxide ($SiO_2$), silicon nitride (SiN), silicon carbide (SiC), carbon doped oxides (e.g., SiCOH), aluminum oxide ($Al_2O_3$), zinc oxide (ZnO), gallium oxide (GaO), boron nitride (BN), etc. In some examples, the backside dielectric layer 32 is spun on, and in other examples the backside dielectric layer 32 (and the backside ground plane 48 and embedded heat spreader 12) is laminated over the backside 24. After curing, the backside dielectric layer 32, via plugs of the signal lines 28, 30, and/or the embedded heat spreader 12 can be machined to provide a planar topside surface.

The backside RDL 14 is designed according to good RF design practices for properly shielded controlled-impedance RF transmission lines using appropriate topologies (e.g., microstrip, stripline, etc.) for mmW circuits (e.g., MMICs). In some examples, the backside RDL 14 can include multiple backside dielectric layers 32 and metal layers to realize microstrip and stripline transmission lines in various layers and configurations.

For high-frequency RF circuits, such as the IC die 16, the proximity of an external circuit assembly, such as the signal lines 28, 30 in the backside RDL 14 or the NHA conductors 36 in the NHA 22, can cause undesirable coupling with RF transmission lines or other EM-sensitive features that interferes with the proper operation and performance of the circuit in the active side 38. Careful simulation and modeling of the influence of these nearby metal features is required to design high-frequency circuits for such an environment, especially for components that extend into mmW frequency bands (e.g., MMICs). Such simulations can be very time consuming (driving up manufacturing costs), and may still fall short of accounting for all interference factors and the resultant RF circuit or system performance can suffer.

In addition to improved thermal spreading and heat transfer 40 from the IC die 16, the chip side up orientation of the IC die 16 and the backside ground plane 48 can reduce or eliminate such undesirable EM coupling between EM-sensitive features on the active side 38 with external circuit assemblies. Such external circuit assemblies can include but are not limited to the signal lines 28, 30 in the backside RDL 14, the NHA 22, and other IC packages 10 or modules in a same electronic device. The EM-sensitive features may include passive components, such as RF transmission lines used for impedance matching, tuning networks, interconnecting conductors, and so on.

In this configuration, the backside ground plane 48 of the IC die 16 acts as an EM shield for the active side 38, which is also covered by the overmold layer 18 (and in some examples, additional shielding over the overmold layer 18). The embedded heat spreader 12 can also function as part of this shielding, making it more robust given the thickness and width of the embedded heat spreader 12. This shielding decouples the IC die 16 from package design issues, allowing for design optimization of the package routing in the backside RDL 14 and the NHA 22 to largely take place without affecting the performance of the IC die 16.

In addition, the backside 24 of the IC die 16 is significantly more planar than the active side 38, which may have thick plated transmission lines and air-bridge cross-overs. The planarity of the backside 24 is also advantageous in the FOWLP (or similar) packaging flow, facilitating a better seal at the edges of the IC die 16, preventing creep of the mold compound during the over-molding process, and providing better patterning uniformity during the formation of the interconnects of the backside RDL 14.

Figure 2:
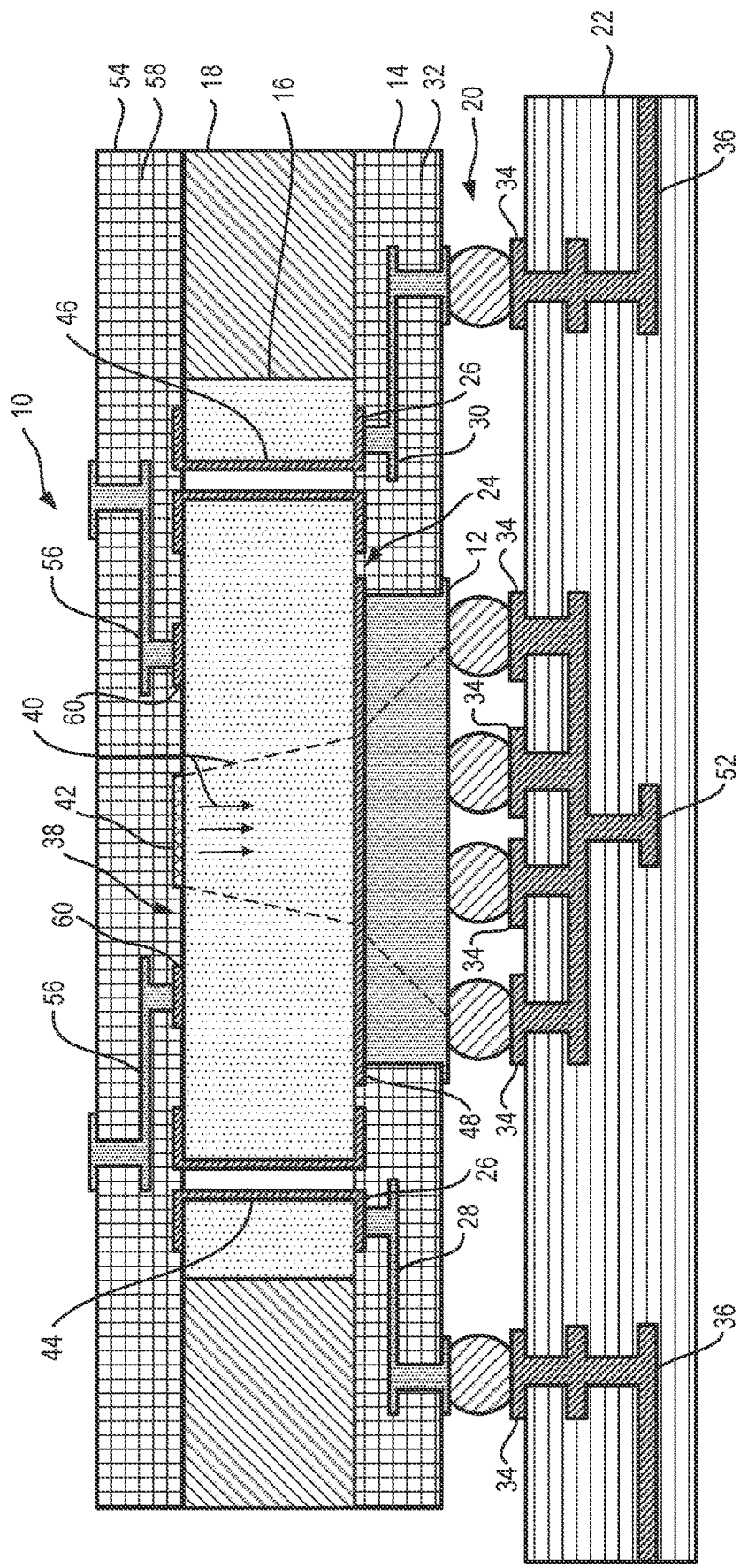
FIG. 2 is a cross-sectional view of another embodiment of the IC package of FIG. 1 with an active side RDL coupled to an active side of an IC die.

FIG. 2 is a cross-sectional view of another embodiment of the IC package 10 of FIG. 1 with an active side RDL 54 coupled to the active side 38 of the IC die 16. The active side RDL 54 includes one or more active side signal lines 56 in an active side dielectric layer 58, which can connect to active side signal pads 60 on the active side 38 of the IC die 16. This configuration adds topside connectivity, which facilitates 3D POP heterogeneous integration. Accordingly, the IC package 10 can include or connect to additional IC dice 16 and/or other circuit components. The active side RDL 54 can be formed in a manner similar to the backside RDL 14 (though generally without the embedded heat spreader 12) and provide interconnections between components 42 and other features of the IC die 16 and another IC die 16 (e.g., a stacked IC die, which may be another MMIC) or other circuit components.

Figure 3:
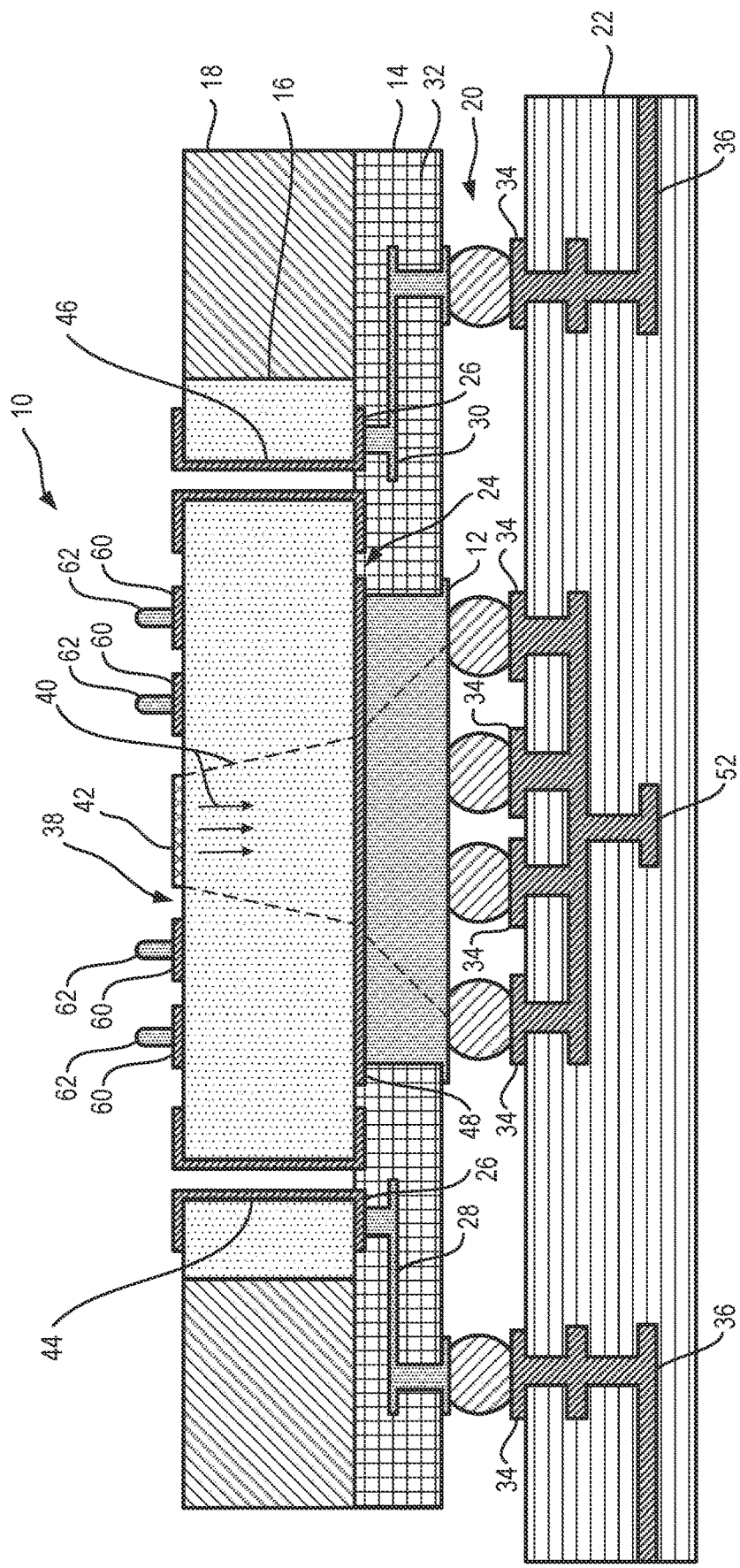
FIG. 3 is a cross-sectional view of another embodiment of the IC package of FIG. 1 with topside connectivity provided by one or more conductive regions.

FIG. 3 is a cross-sectional view of another embodiment of the IC package 10 of FIG. 1 with topside connectivity provided by one or more conductive regions 62. The conductive regions 62 may be copper pillars or similar conductors which connect to the active side signal pads 60 and can also facilitate 3D POP heterogeneous integration with other circuit components. In some examples, the conductive regions 62 are provided through the overmold layer 18, while in others the overmold layer 18 is removed from the active side 38 of the IC die 16 (or only molded to lateral sides of the IC die 16).

Semiconductor processes currently practiced could be used to form the conductive regions 62 similar to the formation of copper bumps for flip-chip-attached semiconductor die (which may be larger than depicted). Alternatively, the conductive regions 62 can be formed as vias or using other appropriate techniques. The conductive regions 62 can be used to conduct heat out of the active side 38 of the IC die 16 if the conductive regions 62 are suitably exposed from the overmold layer 18. In this regard, the conductive regions 62 can be formed before or after depositing the overmold layer 18. If formed before, the overmold layer 18 can be partially removed to expose the conductive regions 62 while leaving a majority of the overmold layer 18 covering the backside of the IC die 16. In some examples, a heat exchanger may be attached to the conductive regions 62 through an appropriate technique, such as soldering or brazing to the conductive regions 62 or through an adhesive. In some examples, an underfill layer surrounds the conductive regions 62 and fills the space between the IC die 16 and an attached circuit component or heat exchanger, though this is not required.

Figure 4:
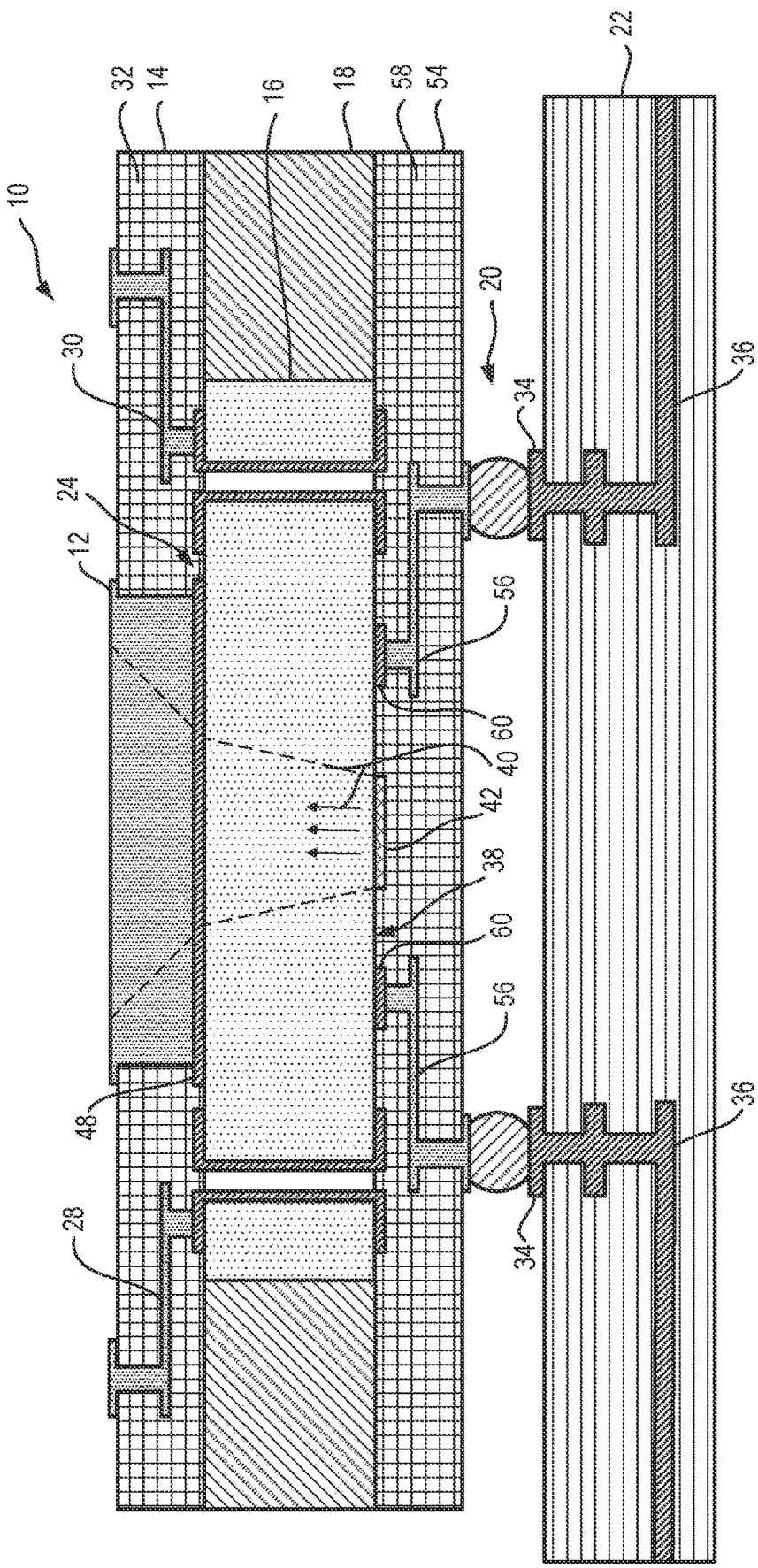
FIG. 4 is a cross-sectional view of another embodiment of the IC package of FIG. 1 oriented chip side down with an active side RDL in addition to the backside RDL.

FIG. 4 is a cross-sectional view of another embodiment of the IC package 10 of FIG. 1 oriented chip side down with the active side RDL 54 in addition to the backside RDL 14. In an exemplary aspect, the thermal spreading and heat transfer 40 from the IC die 16 can be improved by exposing the embedded heat spreader 12 attached to the backside 24 of the IC die 16. A heat exchanger may therefore be directly attached to the embedded heat spreader 12, which may be particularly useful in MMICs which are highly susceptible to thermal variations and/or which produce higher levels of heat.

In this embodiment, the backside RDL 14 is oriented chip down, and the active side RDL 54 provides connection to the NHA 22 through the active side signal lines 56. The backside RDL 14 can optionally include one or more signal lines 28, 30. This may add topside connectivity, which facilitates 3D POP heterogeneous integration with other circuit components. Other examples provide a more traditional IC package 10 with improved thermal spreading and heat transfer 40 via the embedded heat spreader 12.

Figure 5:
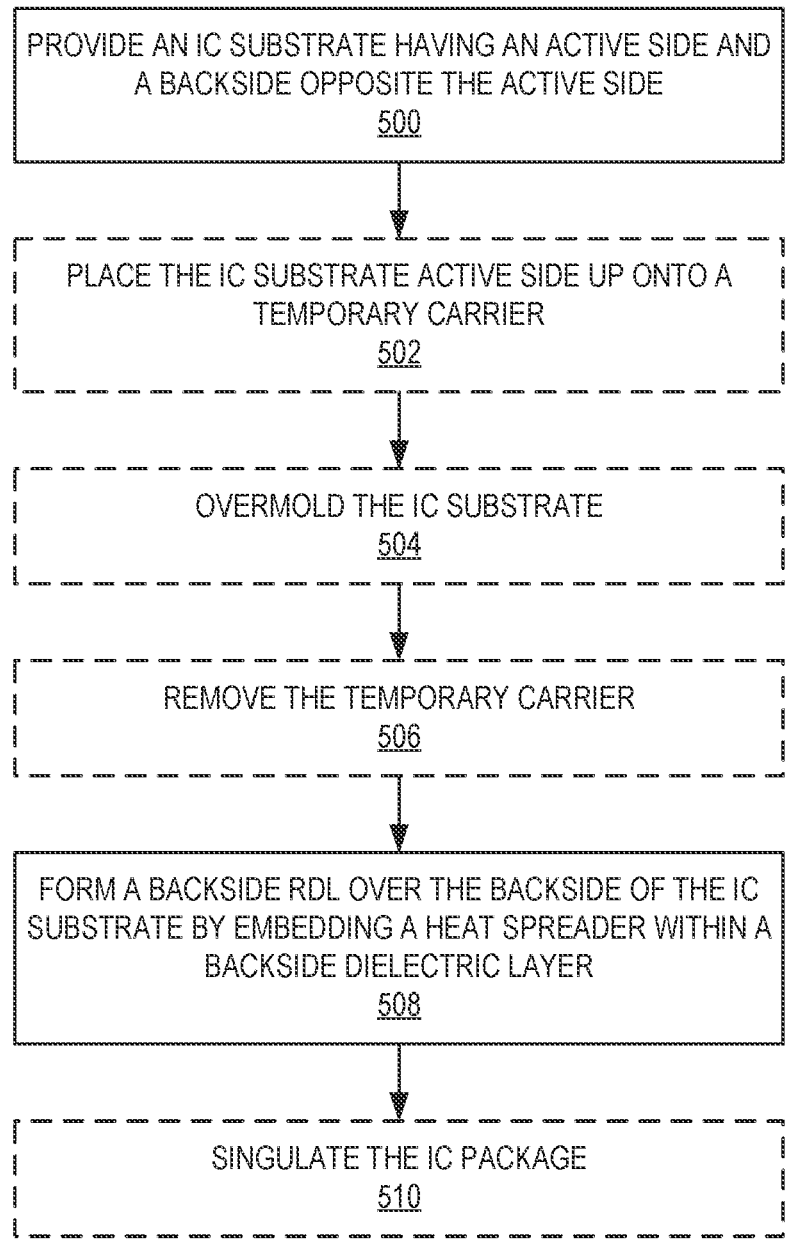
FIG. 5 is a flow diagram illustrating a process for packaging an IC.

FIG. 5 is a flow diagram illustrating a process for packaging an IC. Dashed boxes represent optional steps. The process begins at operation 500, with providing an IC die having an active side and a backside opposite the active side. The process may optionally continue at operation 502, with placing the IC die active side up onto a temporary carrier. The process may optionally continue at operation 504, with overmolding the IC die. The process may optionally continue at operation 506, with removing the temporary carrier.

The process continues at operation 508, with forming a backside RDL over the backside of the IC die by embedding a heat spreader within a backside dielectric layer. In an exemplary aspect, the heat spreader is connected to the backside of the IC die and extends through a thickness of the dielectric material. In some examples, forming the backside RDL includes depositing the backside dielectric layer over the IC die, removing a portion of the dielectric layer, and depositing metal in the removed portion of the dielectric layer to form the heat spreader. The heat spreader can be solid copper, gold, silver, gold tin, aluminum, or another appropriate metal. The process may optionally continue at operation 510, with singulating the IC package.

Although the operations of FIG. 5 are illustrated in a series, this is for illustrative purposes and the operations are not necessarily order dependent. Some operations may be performed in a different order than that presented. For example, operation 508 may be performed before operation 506 or before operation 504. Further, processes within the scope of this disclosure may include fewer or more steps than those illustrated in FIG. 5. For example, the steps of operation 508 can include multiple depositions of dielectric layers and metallization layers to form signal lines, transmission lines (e.g., microstrip and stripline transmission lines), and other RDL features to achieve desired circuit performance.

Those skilled in the art will recognize improvements and modifications to the preferred embodiments of the present disclosure. All such improvements and modifications are considered within the scope of the concepts disclosed herein and the claims that follow.

What is claimed is:
1. A method for packaging an integrated circuit (IC), the method comprising:

providing an IC die having an active side and a backside opposite the active side; and forming a backside polymer redistribution layer (RDL) underneath the backside of the IC die, wherein:
the backside polymer RDL includes a plurality of signal lines, a polymer dielectric layer, and a heat spreader;
the plurality of signal lines is configured to laterally redistribute connections from backside contacts on the backside of the IC die to an opposite surface of the backside polymer RDL;
the polymer dielectric layer encapsulates and isolates the plurality of signal lines from one another; and
the heat spreader is embedded in the polymer dielectric layer and connected to the backside of the IC die, wherein the heat spreader spans a thickness of the polymer dielectric layer, and the heat spreader has a width greater than the thickness of the polymer dielectric layer.

2. The method of claim 1, further comprising:
placing the IC die active side up onto a temporary carrier; and
removing the temporary carrier.

3. The method of claim 2 wherein the backside polymer RDL is formed after the temporary carrier is removed.

4. The method of claim 1, further comprising forming an overmold layer at least surrounding the IC die.

5. The method of claim 4 wherein the backside polymer RDL is formed before the overmold layer is formed, such that the overmold layer is formed over the backside polymer RDL.

6. The method of claim 4, wherein the overmold layer fully encapsulates the IC die.

7. The method of claim 4, wherein the overmold layer encapsulates sides of the IC die.

8. The method of claim 1, wherein forming the backside polymer RDL at least comprises:
depositing the polymer dielectric layer underneath the backside of the IC die;
removing a portion of the polymer dielectric layer; and
depositing at least one metal in the removed portion of the polymer dielectric layer to form the heat spreader and to complete an IC package.

9. The method of claim 8, further comprising singulating the IC package.

10. The method of claim 8, wherein forming the backside polymer RDL further comprises forming the plurality of signal lines within the polymer dielectric layer.

11. The method of claim 8, wherein forming the backside polymer RDL further comprises forming a plurality of transmission lines within the polymer dielectric layer.

12. The method of claim 1 further comprising forming an active side RDL coupled to the active side of the IC die.

13. The method of claim 12 wherein the active side RDL includes an active side dielectric layer, and an active side signal line in the active side dielectric layer and connected to the active side of the IC die.

14. The method of claim 1, wherein the IC die comprises a monolithic microwave integrated circuit (MMIC).

15. The method of claim 1, wherein the heat spreader comprises one or more of copper, gold, silver, gold tin, and aluminum.

16. The method of claim 1, wherein the polymer dielectric layer comprises one or more of polyimide, polynorbornenes, benzocyclobutene (BCB), polytetrafluoroethylene (PTFE), hydrogen silsesquioxane (HSQ), and methylsilsesquioxane (MSQ).

17. The method of claim 4, further comprising:
placing the IC die active side up onto a temporary carrier before the overmold layer is formed; and
removing the temporary carrier after the overmold layer is formed, wherein the backside polymer RDL is formed after the temporary carrier is removed, such that the backside polymer RDL is formed underneath the overmold layer.

18. The method of claim 1, wherein:
the plurality of signal lines comprises a first signal line connected to a first backside signal pad on the backside of the IC die; and
the first signal line is electrically connected to the active side of the IC die through a first through semiconductor via (TSV) through the IC die.

* * * * *